(12) United States Patent
Tak et al.

(10) Patent No.: US 11,467,698 B2
(45) Date of Patent: Oct. 11, 2022

(54) TOUCH SENSOR

(71) Applicant: DONGWOO FINE-CHEM CO., LTD., Iksan-si (KR)

(72) Inventors: Gwang Yong Tak, Goyang-si (KR); Junha Kim, Pyeongtaek-si (KR); Ji-Yeon Kim, Pyeongtaek-si (KR)

(73) Assignee: DONGWOO FINE-CHEM CO., LTD., Iksan-si (KR)

( * ) Notice: Subject to any disclaimer, the term of this patent is extended or adjusted under 35 U.S.C. 154(b) by 0 days.

(21) Appl. No.: 17/047,604

(22) PCT Filed: Apr. 16, 2019

(86) PCT No.: PCT/KR2019/004595
§ 371 (c)(1),
(2) Date: Oct. 14, 2020

(87) PCT Pub. No.: WO2019/203548
PCT Pub. Date: Oct. 24, 2019

(65) Prior Publication Data
US 2021/0149521 A1    May 20, 2021

(30) Foreign Application Priority Data
Apr. 17, 2018    (KR) .......................... 10-2018-0044296

(51) Int. Cl.
*G06F 3/044*        (2006.01)
*G02F 1/1333*       (2006.01)
(Continued)

(52) U.S. Cl.
CPC ........ *G06F 3/0443* (2019.05); *G02F 1/13338* (2013.01); *G02F 1/133528* (2013.01);
(Continued)

(58) Field of Classification Search
CPC ......... G06F 3/0443; G06F 2203/04103; G02F 1/133638; G02F 1/13338; G02F 1/133528; G02F 1/133634; H01L 51/5281
See application file for complete search history.

(56) References Cited

U.S. PATENT DOCUMENTS

| 10,943,971 B2* | 3/2021 | Park ................... G02F 1/13452 |
| 2011/0043465 A1* | 2/2011 | Huang ............... H03K 17/9645 345/173 |

(Continued)

FOREIGN PATENT DOCUMENTS

| JP | 2015-69228 A | 4/2015 |
| KR | 10-2010-0054897 A | 5/2010 |

(Continued)

OTHER PUBLICATIONS

KR 10-2012-0131877, dated Dec. 2012 LG Innotek Co. Ltd. (Goggle Translation of counterpart publication KR101744989B1).*
(Continued)

*Primary Examiner* — Ricardo Osorio
(74) *Attorney, Agent, or Firm* — Sughrue Mion, PLLC

(57) ABSTRACT

A touch sensor includes a substrate and first and second touch sensor electrode layers. The first touch sensor electrode layer is disposed on a first surface of the substrate, and includes a first pad formed on an opposing surface to a surface in contact with the substrate. The second touch sensor electrode layer is disposed on a second surface of the substrate, exposes at least a portion of the surface in contact with the substrate to an outside of the substrate, and includes a second pad formed on the portion exposed to the outside of the surface in contact with the substrate. The first pad and the second pad do not overlap in a stacking direction.

18 Claims, 11 Drawing Sheets

(51) Int. Cl.
*H01L 51/52* (2006.01)
*G02F 1/13363* (2006.01)
*G02F 1/1335* (2006.01)

(52) U.S. Cl.
CPC .. *G02F 1/133634* (2013.01); *G02F 1/133638* (2021.01); *G06F 2203/04103* (2013.01); *H01L 51/5281* (2013.01)

(56) References Cited

U.S. PATENT DOCUMENTS

| | | | | |
|---|---|---|---|---|
| 2013/0319835 | A1* | 12/2013 | Cho | G06F 3/04164 200/295 |
| 2015/0109226 | A1* | 4/2015 | Kim | G06F 3/04164 345/173 |
| 2015/0185942 | A1* | 7/2015 | Kim | G06F 3/0445 345/173 |
| 2015/0212614 | A1 | 7/2015 | Chen et al. | |
| 2018/0006004 | A1* | 1/2018 | Namkung | H01L 27/3276 |
| 2018/0157356 | A1* | 6/2018 | Ma | H01L 51/0097 |
| 2018/0166507 | A1* | 6/2018 | Hwang | G06F 3/041 |
| 2020/0208822 | A1* | 7/2020 | Lee | F21V 23/0485 |

FOREIGN PATENT DOCUMENTS

| | | |
|---|---|---|
| KR | 10-2012-0131876 A | 12/2012 |
| KR | 10-2012-0131877 A | 12/2012 |
| KR | 10-2013-0071863 A | 7/2013 |
| KR | 2013-225279 A | 10/2013 |
| KR | 10-2015-0018272 A | 2/2015 |
| KR | 10-2015-0120113 A | 10/2015 |
| KR | 20150120113 * | 10/2015 |
| KR | 10-1613379 B1 | 4/2016 |

OTHER PUBLICATIONS

International Search Report for PCT/KR2019/004595 dated Aug. 2, 2019 [PCT/ISA/210].
Written Opinion for PCT/KR2019/004595 dated Aug. 2, 2019 [PCT/ISA/237].

* cited by examiner

[Figure 1A]
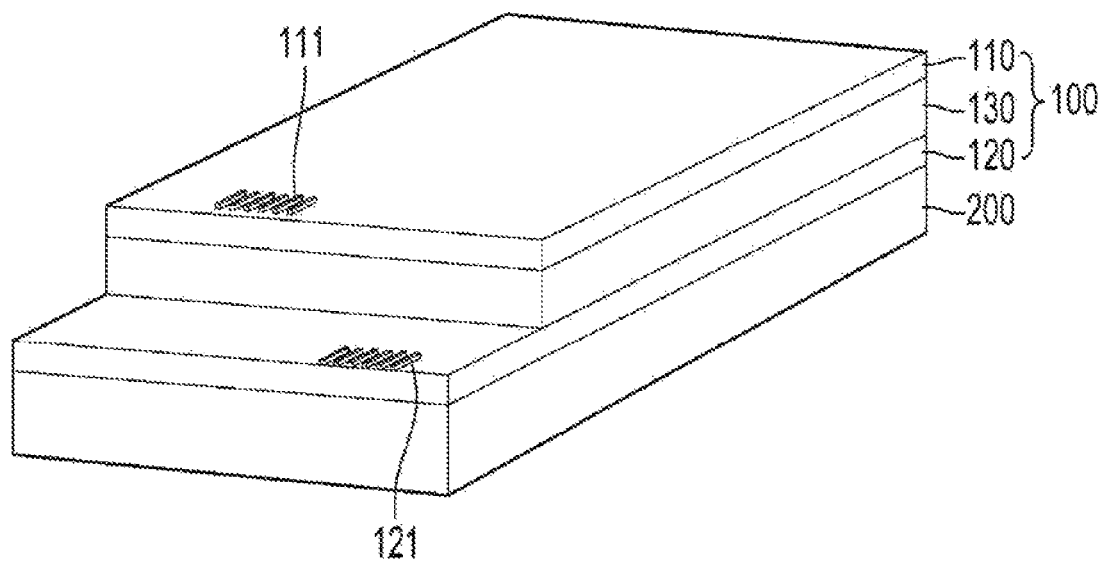
[Figure 1B]
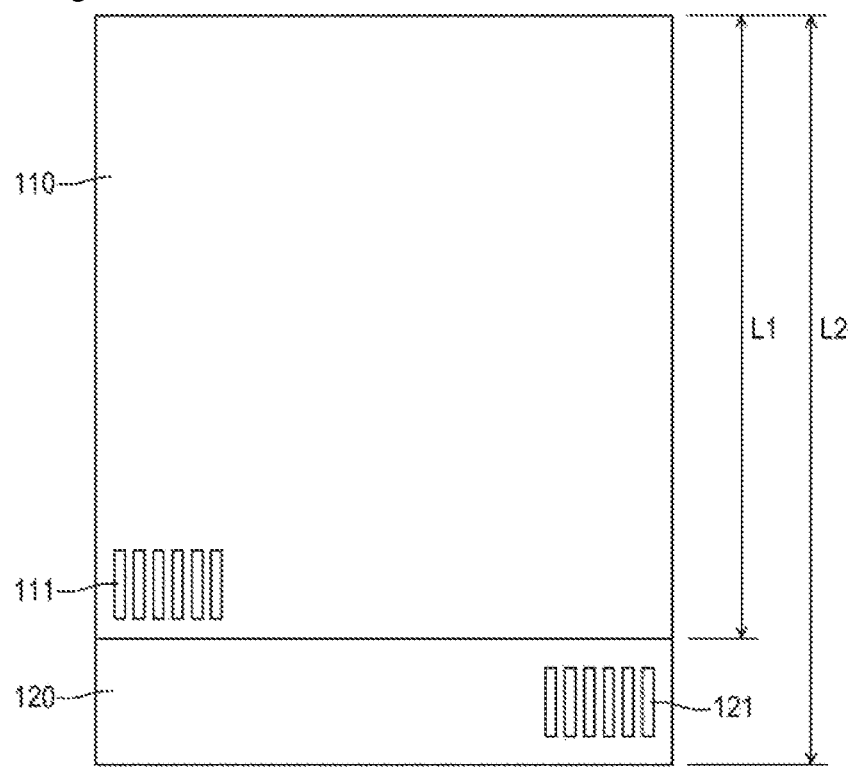

[Figure 1C]
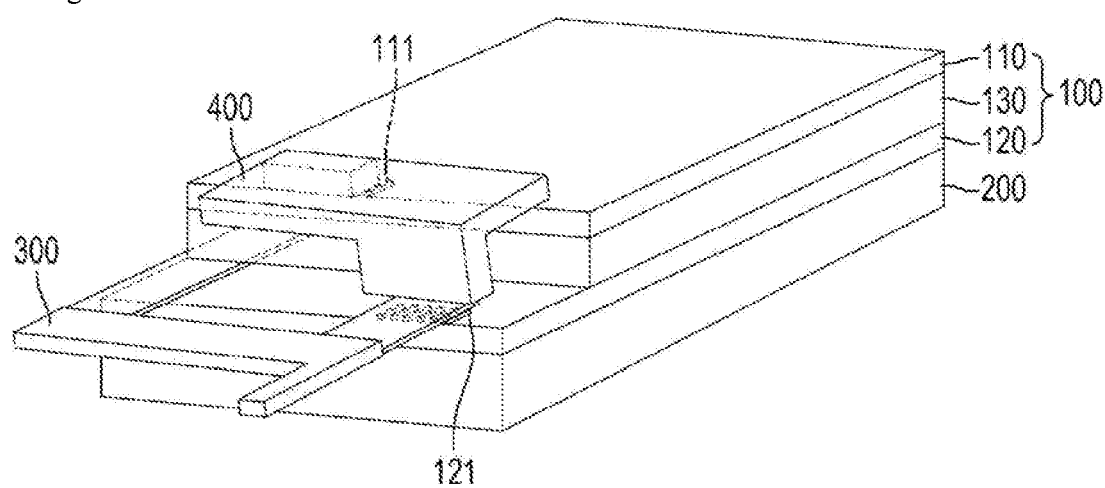
[Figure 2A]
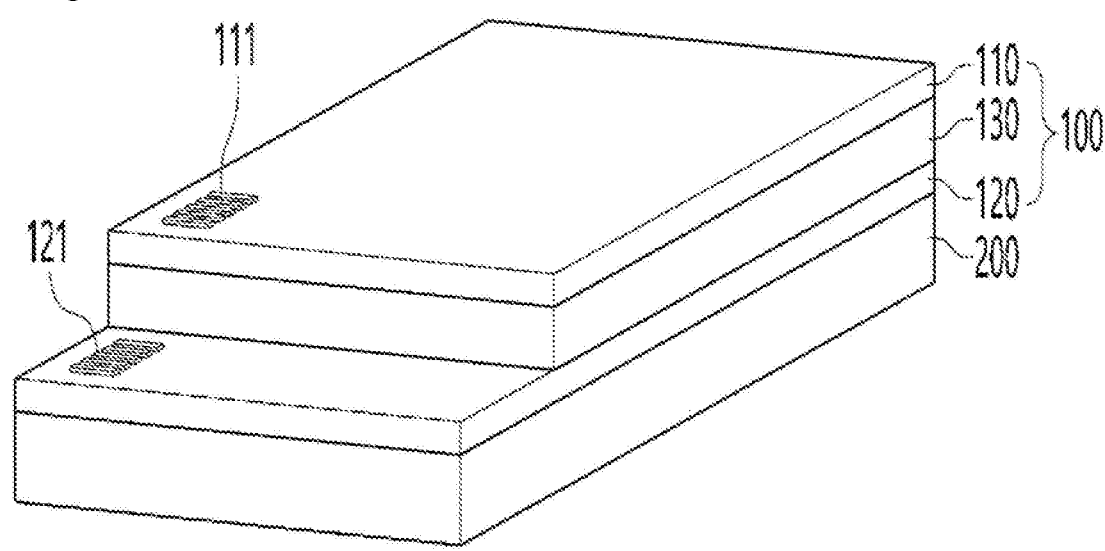

【Figure 2B】
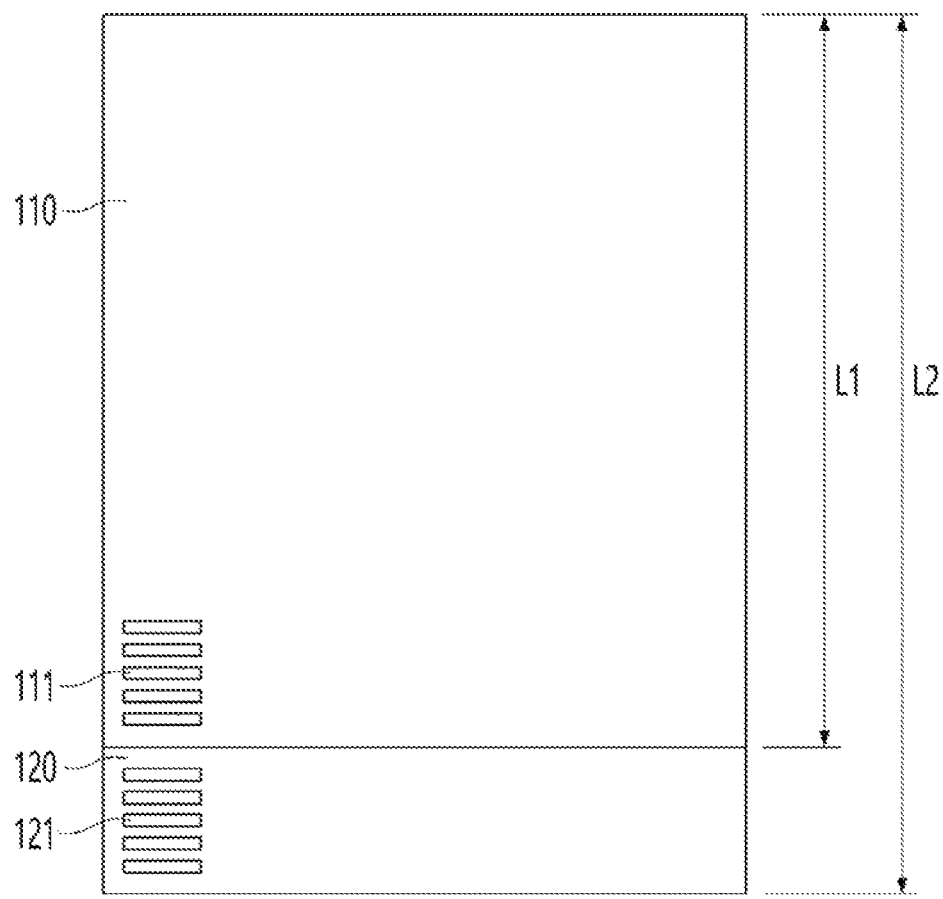
【Figure 2C】
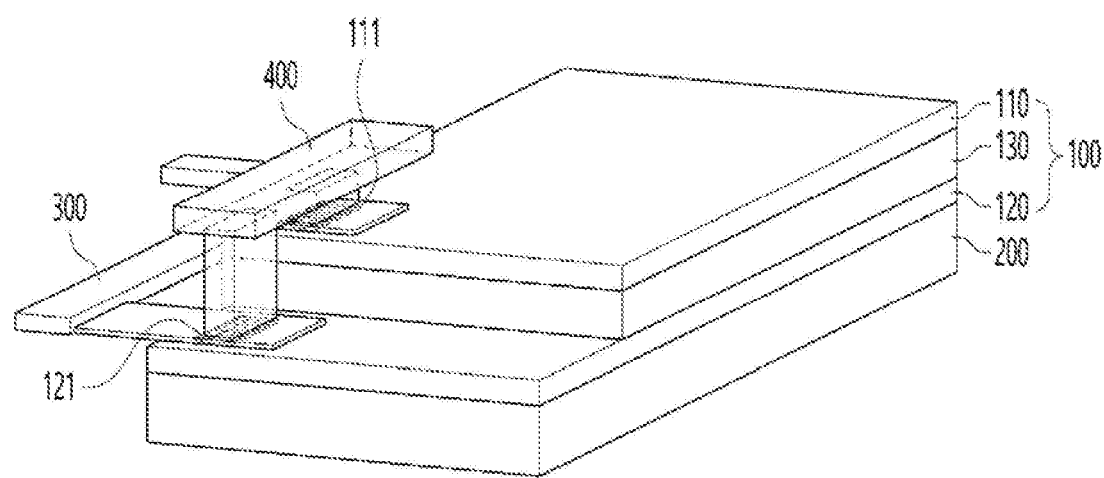

[Figure 3A]
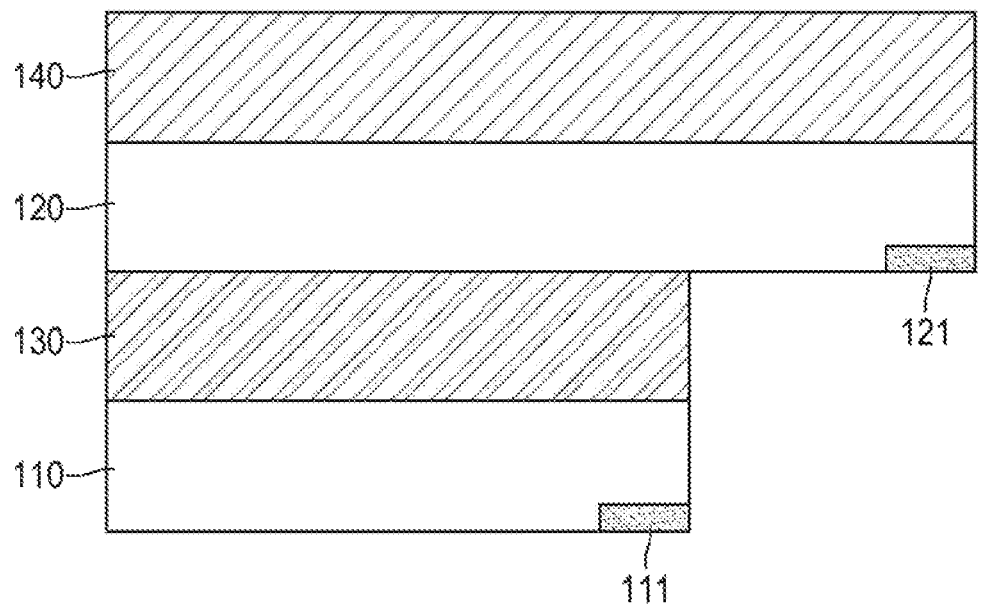
[Figure 3B]
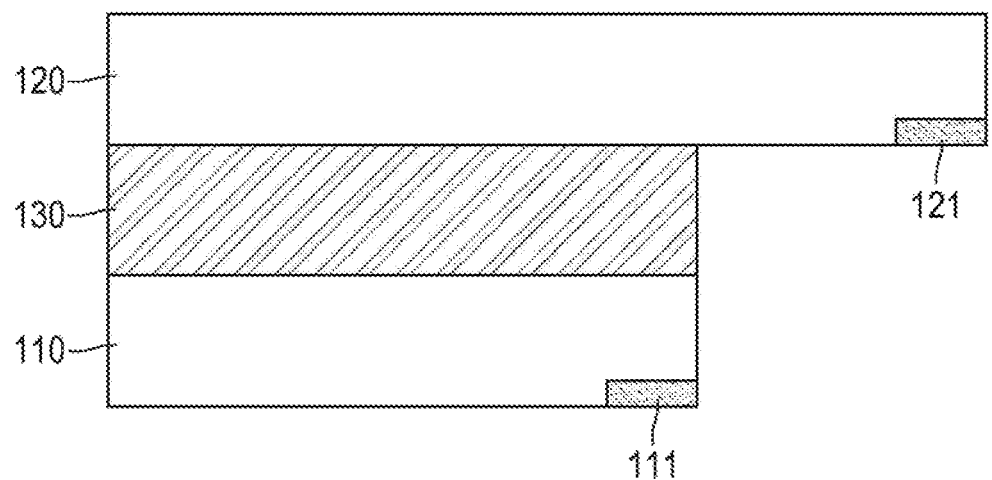

【Figure 3C】
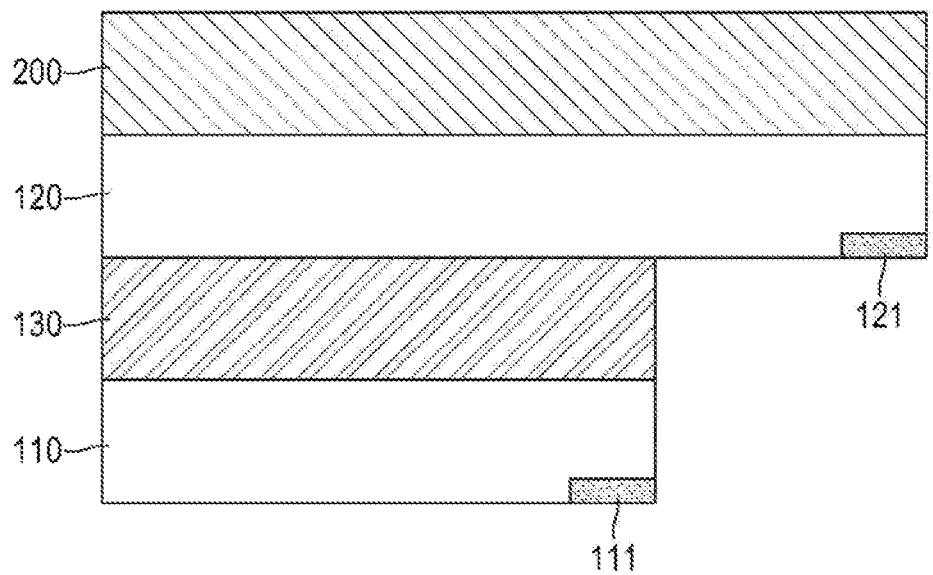
【Figure 3D】
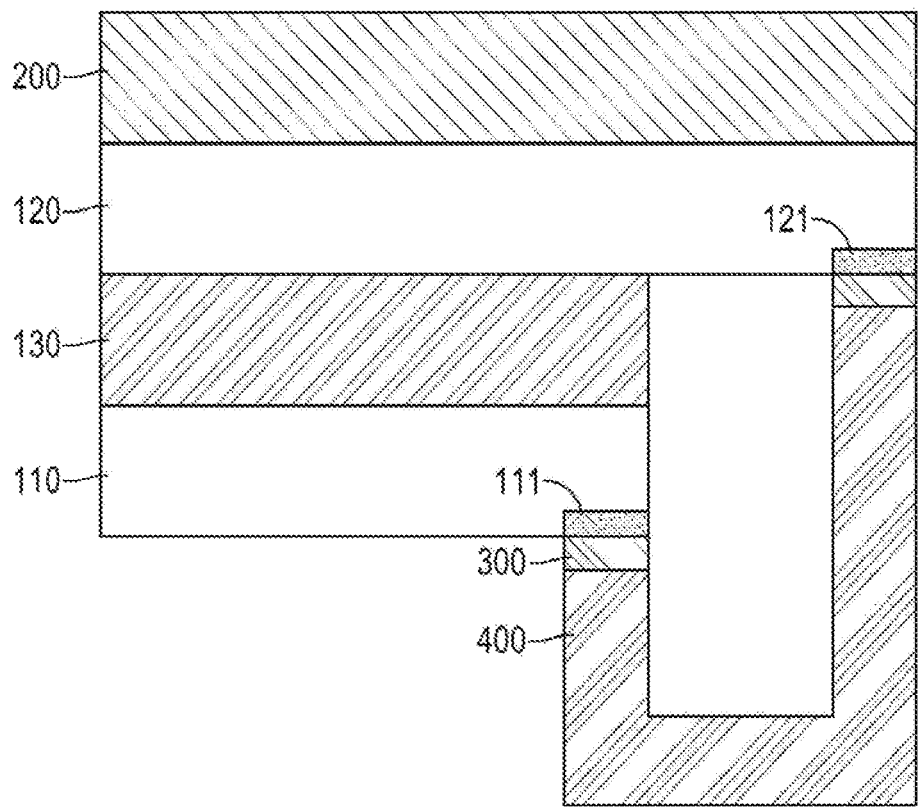

[Figure 3E]
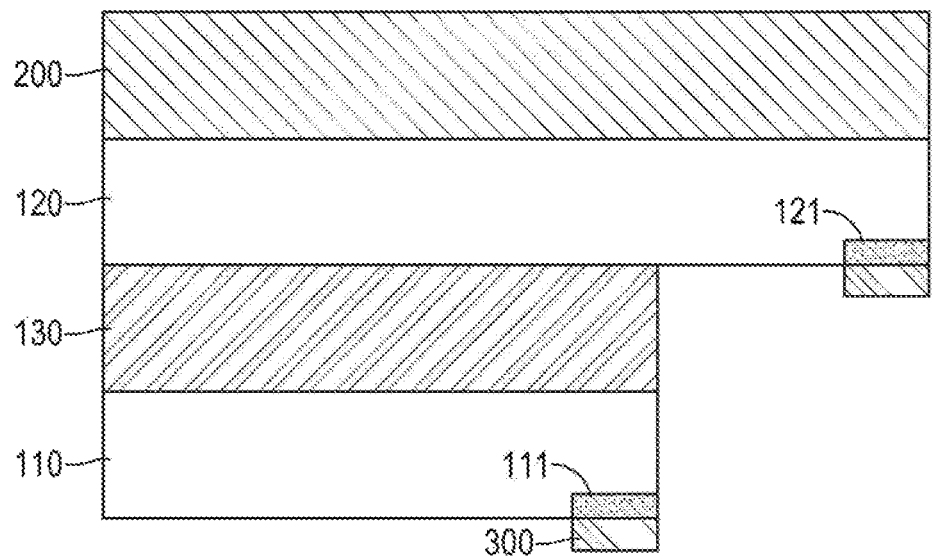
[Figure 4A]
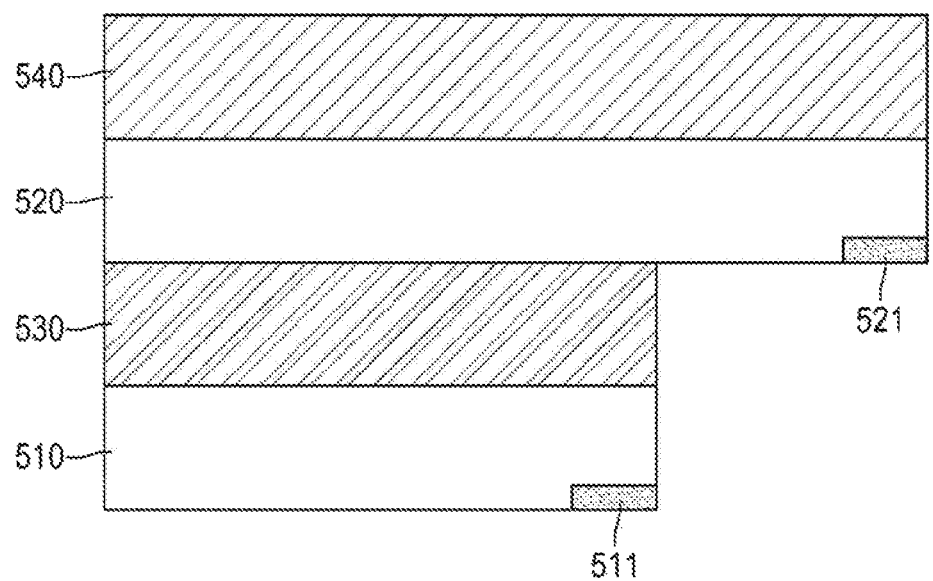

【Figure 4B】
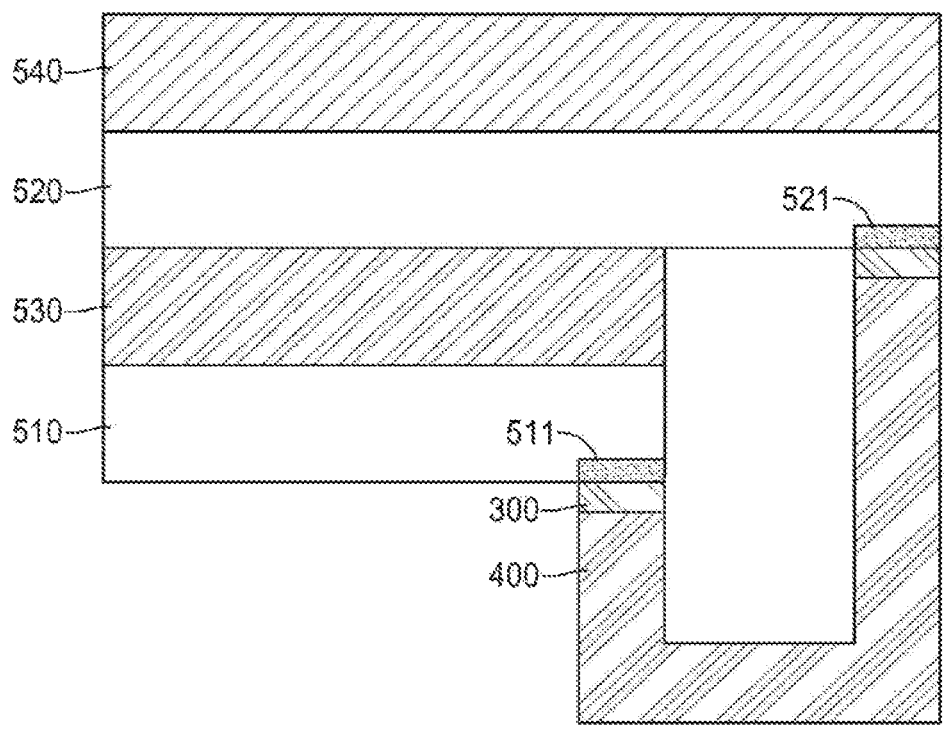
【Figure 4C】
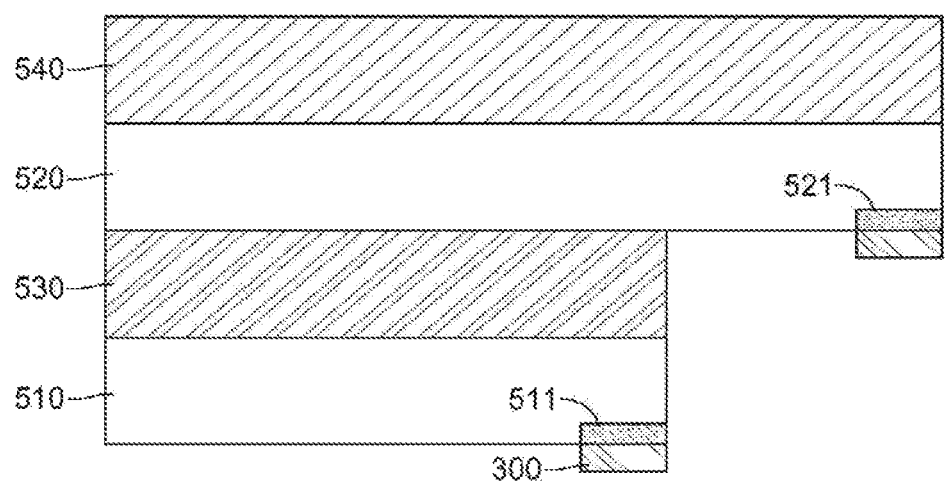

【Figure 4D】
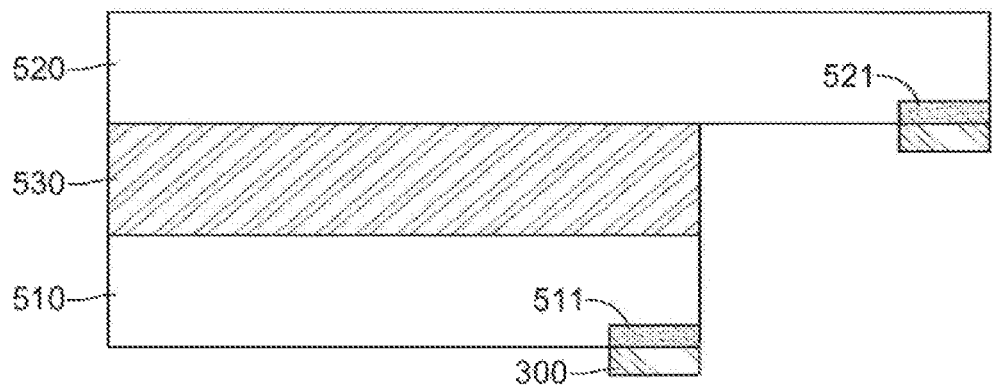
【Figure 4E】
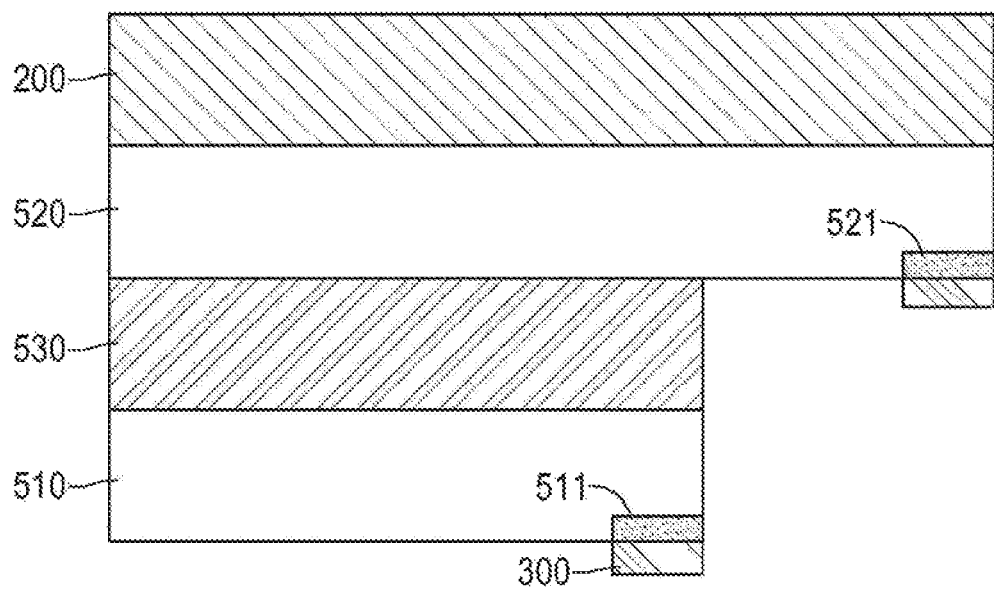

【Figure 5A】
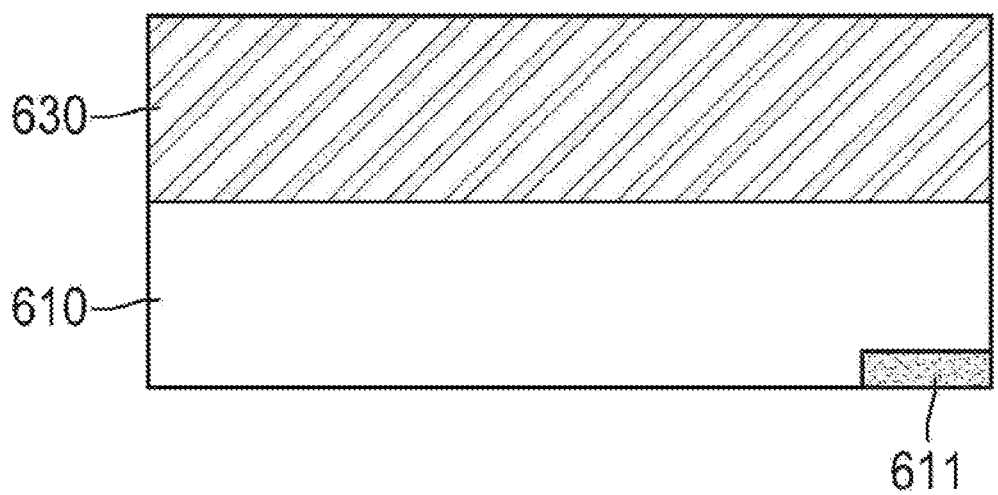
【Figure 5B】
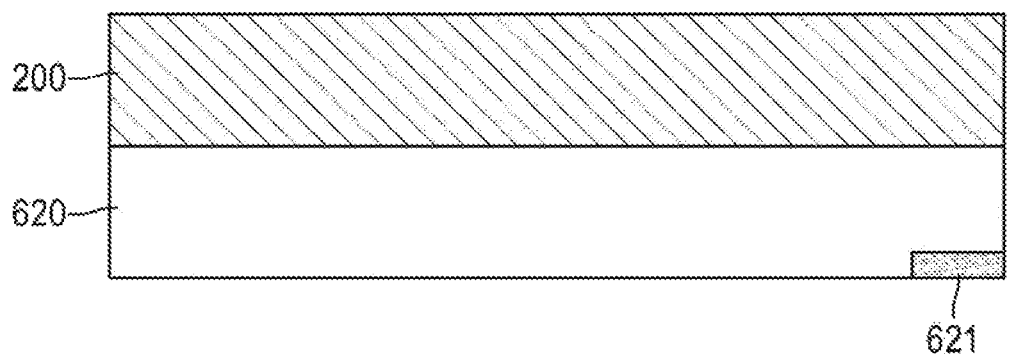

【Figure 5C】
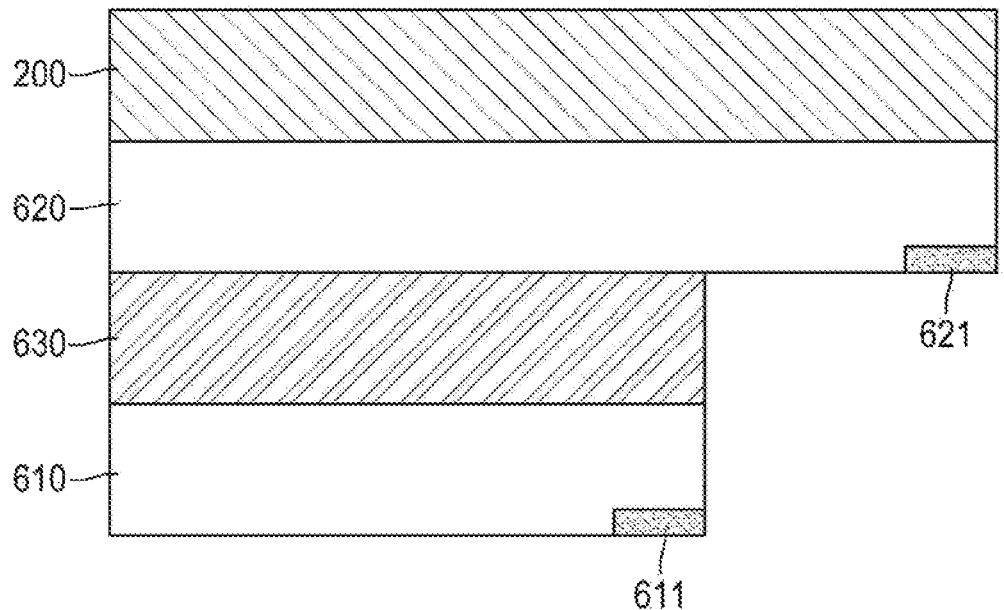
【Figure 5D】
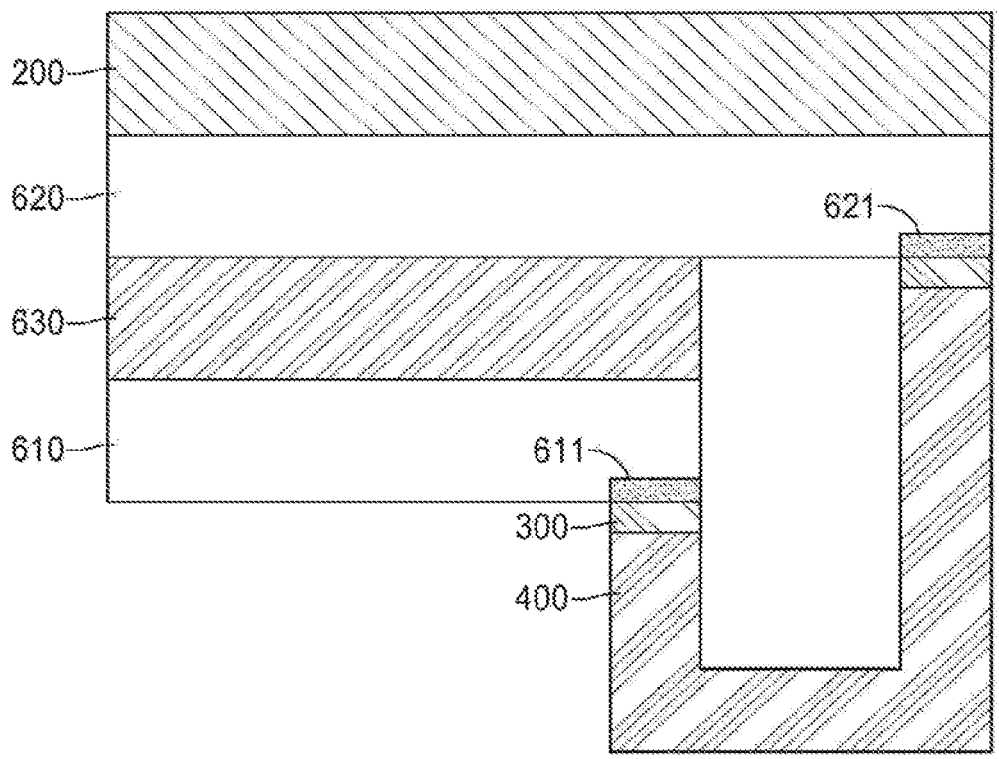

[Figure 5E]
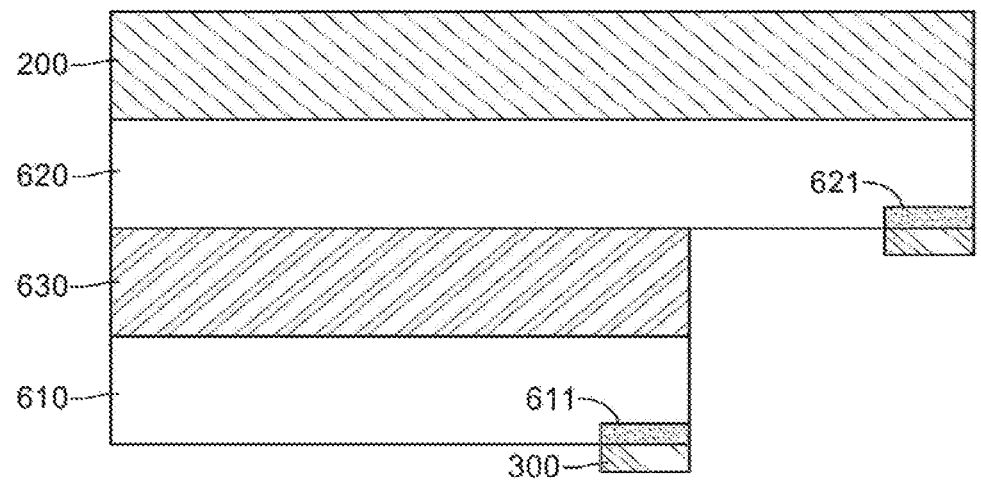

TOUCH SENSOR

CROSS REFERENCE TO RELATED APPLICATIONS

This is a National Stage of International Application No. PCT/KR2019/004595 filed Apr. 16, 2019, claiming priority based on Korean Patent Application No. 10-2018-0044296 filed Apr. 17, 2018, the contents of all of which are incorporated herein by reference in their entirety.

TECHNICAL FIELD

The present invention relates to a touch sensor.

BACKGROUND ART

Recently, a touch input method in which a user directly touches a screen using a finger to input is widely applied to a display device. The touch input method can provide an intuitive and convenient user interface by allowing a user to touch a specific location on the display screen to input.

In addition, the touch input method can be combined with a display screen without a separate input device such as a keyboard or mouse, which is particularly advantageous for portable electronic devices.

In order to combine the touch input method with the display screen, a touch sensor is usually disposed on a display panel.

Korean Patent Registration No. 10-1613379 discloses that a touch screen display can have a flat touch sensor and display structures including a pattern of capacitive electrodes forming a sensor array and a two-dimensional display pixel array.

However, when the touch sensor is disposed on the upper portion of the display, interference may occur in touch recognition due to noise generated from the display. In particular, it is very vulnerable to the influence of noise in a structure in which both the transmitter and the receiver touch sensing electrodes are formed on the same surface of the substrate (also referred to as a single-sided ITO or SITO structure).

On the other hand, a structure in which transmitter and receiver touch sensing electrodes are formed respectively on both sides of a substrate (also referred to as a double-sided ITO or DITO structure) may be used. For example, in US Patent Application Publication No. 2015/0212614 is disclosed a polarizing plate stack comprising: a first substrate and a second substrate; a polarizing layer disposed between the first substrate and the second substrate; and a first layer of a conductive material patterned on a first surface of either the first substrate or the second substrate, wherein the first layer of the conductive material forms an electrode of a capacitive touch sensor panel, and at least one of the first or the second substrate forms a part of a dielectric layer of the capacitive touch sensor panel.

However, in such a DITO structure, since the pads of the two ITO layers are formed on opposite sides, there is a disadvantage in that two bonding processes are required to connect them to a flexible printed circuit board (FPCB).

DISCLOSURE OF INVENTION

Technical Problem

The present invention has been devised from the technical background as described above, and is to provide a touch sensor that is robust against noise and improves recognition sensitivity and recognition rate.

Another object of the present invention is to provide a touch sensor capable of simplifying the bonding process.

Technical Solution

The touch sensor of the present invention for solving such a problem may comprise a substrate, first and second touch sensor electrode layers, first and second pads, and so on.

The first touch sensor electrode layer may be disposed on a first surface of the substrate. The first touch sensor electrode layer may include a first pad, and the first pad may be formed on an opposing surface to a surface in contact with the substrate.

The second touch sensor electrode layer may be disposed on a second surface of the substrate. The second touch sensor electrode layer may expose at least a portion of the surface in contact with the substrate to an outside of the substrate. The second touch sensor electrode layer may include a second pad, and the second pad may be formed on the portion exposed to the outside of the surface in contact with the substrate.

The first pad and the second pad may be disposed not to overlap in a stacking direction.

In the touch sensor of the present invention, the first pad may be disposed adjacent to the portion exposed to the outside of the second touch sensor electrode layer.

In the touch sensor of the present invention, the first pad and the second pad may be disposed to overlap in a length direction of the substrate.

In the touch sensor of the present invention, the substrate may be a polarizing plate.

In the touch sensor of the present invention, the first and the second touch sensor electrode layers may be made of a transparent conductive material.

The touch sensor of the present invention may further comprise a flexible printed circuit board (FPCB) electrically connected to the first and the second pads.

According to another aspect of the present invention, a display device comprising the above touch sensor and a display layer disposed on an opposing surface to a surface of the second touch sensor electrode layer in contact with the substrate is provided.

The display layer may be an OLED layer or an LCD layer.

According to yet another aspect of the present invention, a bonding tip comprising: first and second ends having dimensions corresponding to the positions of the first and second pads, respectively, of the above touch sensor; and a body part connecting the first and second ends is provided.

According to a further aspect of the present invention, a method of manufacturing a display device comprising steps of: forming a first touch sensor electrode layer including a first pad on a first surface of a substrate; forming a second touch sensor electrode layer including a second pad on a protective film; disposing the second touch sensor electrode layer on a second surface of the substrate such that the second pad is exposed to an outside of the substrate in the same direction as the first pad; removing the protective film; attaching a display layer to a surface of the second touch sensor electrode layer from which the protective film is removed; and bonding an FPCB simultaneously to the first and the second pads is provided.

According to another aspect of the present invention, a method of manufacturing a display device comprising steps of: forming a first touch sensor electrode layer including a first pad on a first surface of a substrate; forming a second touch sensor electrode layer including a second pad on a protective film; disposing the second touch sensor electrode layer on a second surface of the substrate such that the second pad is exposed to an outside of the substrate in the same direction as the first pad; bonding an FPCB simultaneously to the first and the second pads; removing the protective film; and attaching a display layer to a surface of the second touch sensor electrode layer from which the protective film is removed is provided.

According to yet another aspect of the present invention, a method of manufacturing a display device comprising steps of: forming a first touch sensor electrode layer including a first pad on a first surface of a substrate; forming a second touch sensor electrode layer including a second pad on a display layer; disposing the second touch sensor electrode layer on a second surface of the substrate such that the second pad is exposed to an outside of the substrate in the same direction as the first pad; and bonding an FPCB simultaneously to the first and the second pads is provided.

In the method of manufacturing a display device, the step of bonding the FPCB simultaneously to the first and the second pads may be performed using the bonding tip described above.

In the method of manufacturing a display device, the substrate may be a polarizing plate.

Advantageous Effects

According to the touch sensor of the present invention, by separating and disposing the transmitter and the receiver touch sensor electrode layers on the opposite surfaces of the substrate, it can be robust against noise from the display unit, and as a result, the recognition sensitivity and recognition rate of the touch sensor can be greatly increased.

In addition, according to the touch sensor of the present invention, by disposing the first pad of the first touch sensor electrode layer and the second pad of the second touch sensor electrode layer to face the same direction, the two touch sensor electrode layers may be simultaneously bonded to the FPCB in a single bonding process. Accordingly, the process can be simplified and manufacturing time and cost can be reduced.

DESCRIPTION OF DRAWINGS

FIG. 1A is a schematic perspective view of a display device including a touch sensor according to an embodiment of the present invention.

FIG. 1B is a plan view of the display device of FIG. 1A.

FIG. 1C is a schematic diagram showing a process of bonding a touch sensor according to an embodiment of the present invention and an FPCB.

FIG. 2A is a schematic perspective view of a display device including a touch sensor according to another embodiment of the present invention.

FIG. 2B is a plan view of the display device of FIG. 2A.

FIG. 2C is a schematic diagram showing a process of bonding a touch sensor according to another embodiment of the present invention and an FPCB.

FIGS. 3A to 3E are views showing the first embodiment of a method of manufacturing a display device including a touch sensor according to an embodiment of the present invention.

FIGS. 4A to 4E are views showing the second embodiment of a method of manufacturing a display device including a touch sensor according to an embodiment of the present invention.

FIGS. 5A to 5E are views showing the third embodiment of a method of manufacturing a display device including a touch sensor according to an embodiment of the present invention.

BEST MODE

Hereinafter, the present invention will be described in detail with reference to the drawings. However, the drawings attached to the present specification are only examples for explaining the present invention, and the present invention is not limited by the drawings. In addition, for convenience of description, some components may be exaggerated, reduced, or omitted in the drawings.

FIG. 1A is a schematic perspective view of a display device including a touch sensor according to an embodiment of the present invention. FIG. 1B is a plan view of the display device of FIG. 1A.

Referring to FIG. 1A, the display device according to an embodiment of the present invention has a structure in which a touch sensor 100 is disposed on a display layer 200. In the touch sensor 100, a first touch sensor electrode layer 110 is disposed on a first surface of a polarizing plate 130 and a second touch sensor electrode layer 120 is disposed on a second surface of the polarizing plate 130 with the polarizing plate 130 serving as a substrate therebetween.

One of the first and the second touch sensor electrode layers 110 and 120 serves as a receiver electrode of the touch sensor 100, and the other serves as a transmitter electrode of the touch sensor 100.

The first and the second touch sensor electrode layers 110 and 120 may be formed using a transparent conductive material so that the pattern is not visually recognized.

Specifically, the first and second touch sensor electrode layers 110 and 120 may be formed of at least one material selected from metal oxide, metal mesh, metal nanowire, carbon nanotube, graphene, conductive polymer, and conductive ink.

As the metal mesh, for example, gold (Au), silver (Ag), copper (Cu), molybdenum (Mo), nickel (Ni), chromium (Cr), aluminum (Al), silver-palladium-copper alloy (APC) or the like may be used, but it is not limited thereto.

The metal oxide may be any one of indium tin oxide (ITO), indium zinc oxide (IZO), indium zinc tin oxide (IZTO), aluminum zinc oxide (AZO), gallium zinc oxide (GZO), fluorine tin oxide (FTO), and zinc oxide (ZnO).

The metal nanowire may be any one of silver nanowire, copper nanowire, zirconium nanowire, and gold nanowire.

The conductive polymer includes polypyrrole, polythiophene, polyacetylene, PEDOT, and polyaniline, and the conductive ink includes an ink in which a metal powder and a curable polymer binder are mixed.

Alternatively, in order to reduce electrical resistance while securing transmittance, in some cases, the first and second touch sensor electrode layers 110 and 120 may be formed in a stacked structure of two or more conductive layers. For example, they can be formed in a triple layer structure of metal oxide/metal/metal oxide.

In addition, a triple layer structure of metal oxides may be used, and for example, a structure of IZO/APC/IZO or ITO/APC/ITO may be used.

The first and second touch sensor electrode layers 110 and 120 may be made of ITO having a thickness of, for example, 1 to 1250 Å, and the sheet resistance thereof may be, for example, 0.5 to 20Ω/□.

In the touch sensor 100 according to an embodiment of the present invention, since the first and second touch sensor electrode layers 110 and 120 are individually positioned with the polarizing plate 130 therebetween, it is robust against noise generated by the display layer 200. Therefore, touch sensitivity and recognition rate are improved.

The polarizing plate 130 may be any one known to be used in a display device.

Specifically, polyvinyl alcohol (PVA), cellulose triacetate (TAC) or cyclo-olefin polymer (COP) film may be used, but it is not limited thereto.

The polarizing plate may have a thickness of 1 to 100 µm, for example.

Meanwhile, the polarizing plate 130 serves as a substrate for the first and second touch sensor electrode layers 110 and 120, and a transparent film may be used instead of the polarizing plate 130.

The transparent film is not limited if it has good transparency, mechanical strength and thermal stability. Specific examples of the transparent film may include thermoplastic resins, e.g., polyester resins such as polyethylene terephthalate, polyethylene isophthalate, polyethylene naphthalate and polybutylene terephthalate; cellulose resins such as diacetylcellulose and triacetylcellulose; polycarbonate resins; acrylate resins such as polymethyl (meth)acrylate and polyethyl (meth)acrylate; styrene resins such as polystyrene and acrylonitrile-styrene copolymer; polyolefin resins such as polyethylene, polypropylene, polyolefin having a cyclic or norbornene structure, and ethylene-propylene copolymer; vinyl chloride resins; amide resins such as nylon and aromatic polyamide; imide resins; polyethersulfone resins; sulfone resins; polyether ether ketone resins; polyphenylene sulfide resins; vinyl alcohol resins; vinylidene chloride resins; vinyl butyral resins; allylate resins; polyoxymethylene resins; and epoxy resins. Also, a film consisting of a blend of the thermoplastic resins may be used. In addition, thermally curable or UV curable resins such as (meth)acrylate, urethane, acrylic urethane, epoxy and silicon resins may be used.

Such a transparent film may have a suitable thickness. Typically, considering workability in terms of strength and handling, or thin layer property, the thickness of the transparent film may range from 1 to 500 µm, preferably 1 to 300 µm, more preferably 5 to 200 µm.

The transparent film may contain at least one suitable additive. Examples of the additive may include an UV absorber, an antioxidant, a lubricant, a plasticizer, a releasing agent, a coloring-preventing agent, an anti-flame agent, an anti-static agent, a pigment and a colorant. The transparent film may comprise various functional layers including a hard coating layer, an anti-reflective layer and a gas barrier layer on one surface or both surface thereof, but the functional layer is not limited thereto. That is, other functional layers may also be included depending on the desired use.

If necessary, the transparent film may be surface-treated. For example, the surface treatment may be carried out by drying method such as plasma, corona and primer treatment, or by chemical method such as alkali treatment including saponification. Also, the transparent film may be an isotropic film, a retardation film or a protective film.

In the case of the isotropic film, it is preferred to satisfy an in-plane retardation (Ro) of 40 nm or less, preferably 15 nm or less and a thickness retardation (Rth) of −90 nm to +75 nm, preferably −80 nm to +60 nm, particularly −70 nm to +45 nm, the in-plane retardation (Ro) and thickness retardation (Rth) being represented by the following equations.

$$Ro=[(nx-ny)*d]$$

$$Rth=[(nx+ny)/2-nz]*d$$

wherein, nx and ny are each a main refractive index in a film plane, nz is a refractive index in the thickness direction of film, and d is a thickness of film.

The retardation film may be prepared by uniaxial stretching or biaxial stretching of a polymer film, coating of a polymer or coating of a liquid crystal, and it is generally used for improvement or control of optical properties, e.g., viewing angle compensation, color sensitivity improvement, light leakage prevention, or color control of a display.

The retardation film may include a half-wave (½) or quarter-wave (¼) plate, a positive C-plate, a negative C-plate, a positive A-plate, a negative A-plate, and a biaxial plate.

The protective film may be a polymer resin film comprising a pressure-sensitive adhesive (PSA) layer on at least one surface thereof, or a self-adhesive film such as polypropylene.

Referring to FIG. 1A and FIG. 1B, the polarizing plate 130 and the first touch sensor electrode layer 110 have the same length L1, the display unit 200 and the second touch sensor electrode layer 120 have the same length L2, and L2 is greater than L1.

The second touch sensor electrode layer 120 has a second pad 121 in a region exposed without overlapping with the polarizing plate 130 and the first touch sensor electrode layer 110 in the stacking direction, that is, in the vertical direction.

The first touch sensor electrode layer 110 has a first pad 111 that does not overlap with the second pad 121 in the longitudinal direction (in the direction of L1 and L2 in FIG. 1B) at a position adjacent to the second pad 121.

In FIG. 1A and FIG. 1B, the first pad 111 is shown to be positioned at the lower left of the first touch sensor electrode layer 110 and the second pad 121 is shown to be positioned at the lower right of the second touch sensor electrode layer 120. However, the positions of the first and second pads 111 and 121 are not limited thereto.

The first and second pads 111 and 121 are the parts electrically connected to an FPCB (not shown in FIG. 1A and FIG. 1B) outside the touch sensor 100 to drive the first and second touch sensor electrode layers 110 and 120, respectively.

As the display layer 200, anything that can be applied to a display device may be used without limitation, and may be, for example, an OLED layer or an LCD layer, but is not limited thereto.

The display device according to an embodiment of the present invention described with reference to FIG. 1A and FIG. 1B has a robust characteristic against noise by having transmitter and receiver touch sensor electrode layers respectively on both sides of the substrate, and it can be bonded with the FPCB in a single bonding process.

FIG. 1C is a schematic diagram showing a process of bonding a touch sensor according to an embodiment of the present invention and an FPCB.

As shown in FIG. 1C, in order to simultaneously bond the first and second pads 111 and 121 with an FPCB 300, a bonding tip 400 includes two ends having positions corresponding to the position of the first and second pads 111 and 121, respectively, and having two different lengths.

That is, the two ends of the bonding tip 400 have a length difference equal to the sum of the thicknesses of the first touch sensor electrode layer 110 and the polarizing plate 130.

In addition, the FPCB 300 includes two ends that can be bonded to the first and second pads 111 and 121, respectively.

Through this structure, the touch sensor according to an embodiment of the present invention can bond the transmitter and the receiver touch sensor electrode layers formed respectively on both sides of the substrate with the single FPCB 300 through a single bonding process.

FIG. 2A is a schematic perspective view of a display device including a touch sensor according to another embodiment of the present invention, FIG. 2B is a plan view of the display device of FIG. 2A, and FIG. 2C is a schematic diagram showing a process of bonding a touch sensor according to another embodiment of the present invention and an FPCB.

As shown in FIGS. 2A to 2C, a first pad 111 may be disposed adjacent to an externally exposed portion of a second touch sensor electrode layer 120. Through this, the distance between the first pad 111 and a second pad 121 can be reduced, thereby reducing the spacing between bonding portions of an FPCB 300, and also reducing the distance between pressing portions, that is, first and second ends of a bonding tip 400. As a result, the size of the bonding tip 400 may be reduced.

As in FIGS. 2A to 2C, when the first pad 111 and the second pad 121 are disposed to overlap in the longitudinal direction of a polarizing plate 130 (in the L1 and L2 directions in FIG. 2B), minimization of the spacing between the first pad 111 and the second pad 121, minimization of the spacing between the bonding portions of the FPCB 300, and minimization of the size of the bonding tip 400 can be achieved at the same time.

When the first pad 111 and the second pad 121 are disposed to overlap in the longitudinal direction of the polarizing plate 130 (in the L1 and L2 directions in FIG. 2B), as shown in FIGS. 2A to 2C, it may be advantageous to arrange the first pad 111 and the second pad 121 in a direction perpendicular to the longitudinal direction of the polarizing plate 130 (L1 and L2 directions in FIG. 2B) for bonding the two touch sensor electrode layers 110 and 120 with the FPCB 300 simultaneously in a single bonding process.

A method of manufacturing a display device including a touch sensor according to an embodiment of the present invention will be described in detail.

FIGS. 3A to 3E are views showing the first embodiment of a method of manufacturing a display device including a touch sensor according to an embodiment of the present invention.

First, as shown in FIG. 3A, a first touch sensor electrode layer 110 is formed on a first surface of a polarizing plate 130, a second touch sensor electrode layer 120 is formed on a protective film 140, and then the second touch sensor electrode layer 120 is placed on a second surface of the polarizing plate 130.

At this time, the first and second touch sensor electrode layers 110 and 120 may be formed by a direct transfer method.

The first and second touch sensor electrode layers 110 and 120 include first and second pads 111 and 121, respectively.

Next, as shown in FIG. 3B, the protective film 140 is removed, and as shown in FIG. 3C, a display layer 200 is attached.

And, as shown in FIG. 3D, an FPCB 300 is bonded using a bonding tip 400 having two ends of different lengths corresponding to the positions of the first and second pads 111 and 121, respectively. Then, as shown in FIG. 3E, the first and second touch sensor electrode layers 110 and 120 may be bonded to the FPCB 300 through a single bonding process.

Bonding of the first and second pads 111 and 121 and the FPCB 300 may be performed using, for example, an anisotropic conductive film (ACF).

FIGS. 4A to 4E are views showing the second embodiment of a method of manufacturing a display device including a touch sensor according to an embodiment of the present invention.

First, as shown in FIG. 4A, a first touch sensor electrode layer 510 is formed on a first surface of a polarizing plate 530, and a second touch sensor electrode layer 520 is formed on a protective film 540 to place the second touch sensor electrode layer 120 on a second surface of the polarizing plate 530.

At this time, the first and second touch sensor electrode layers 510 and 520 may be formed by a direct transfer method.

The first and second touch sensor electrode layers 510 and 520 include first and second pads 511 and 521, respectively.

Next, as shown in FIG. 4B, an FPCB 300 is bonded to the first and second pads 511 and 521 using a bonding tip 400 having two ends of different lengths corresponding to the positions of the first and second pads 511 and 521, respectively, to obtain a structure shown in FIG. 4C.

Then, as shown in FIG. 4D, the protective film 540 on the second touch sensor electrode layer 520 is removed, and, as shown in FIG. 4E, a display layer 200 is attached on the second touch sensor electrode layer 520.

FIGS. 5A to 5E are views showing the third embodiment of a method of manufacturing a display device including a touch sensor according to an embodiment of the present invention.

As shown in FIG. 5A, a first touch sensor electrode layer 610 is formed on a first surface of a polarizing plate 630, and as shown in FIG. 5B, a second touch sensor electrode layer 620 is formed on a first surface of a display layer 200.

At this time, the first and the second touch sensor electrode layers 610 and 620 may be formed by a direct transfer method.

The first and second touch sensor electrode layers 610 and 620 include first and second pads 611 and 621, respectively.

Next, as shown in FIG. 5C, two laminates shown in FIGS. 5A and 5B, respectively are attached such that the surface on which the second pad 621 of the second touch sensor electrode layer 620 is formed is attached to the second surface of the polarizing plate 630.

The subsequent process is similar to that in the first embodiment. As shown in FIG. 5D, an FPCB 300 is bonded using a bonding tip 400 having two ends of different lengths corresponding to the positions of the first and second pads 611 and 621, respectively to obtain a structure as shown in FIG. 5E.

In the above description, a polarizing plate was exemplified as a substrate, but the substrate may include a retardation film, a polymer substrate such as PET-based, PI-based, and COP-based, a glass substrate, etc. in addition to the polarizing plate. In addition, any type of substrate to which two ITO layers can be attached with an adhesive and supported can be used.

The preferred embodiments of the present invention have been described with reference to the drawings. However, the present invention is not limited to the above-described embodiments, and it will be understood that the present invention can be implemented in a modified form without departing from the essential characteristics of the present

DESCRIPTION OF REFERENCE NUMERALS

| | |
|---|---|
| 100: touch sensor | 110, 510, 610: first touch sensor electrode layer |
| 111, 511, 611: first pad | |
| 120, 520, 620: second touch sensor electrode layer | |
| 121, 521, 621: second pad | 130, 530, 630: polarizing plate |
| 140, 540: protective film | 200: display layer |
| 300: FPCB | 400: bonding tip |

The invention claimed is:

1. A touch sensor comprising:
a substrate;
a first touch sensor electrode layer disposed on a first surface of the substrate and including a first pad formed on an opposing surface to a surface in contact with the substrate;
a second touch sensor electrode layer disposed on a second surface of the substrate, exposing at least a portion of the surface in contact with the substrate to an outside of the substrate, and including a second pad formed on the portion exposed to the outside of the surface in contact with the substrate, wherein
the first pad and the second pad do not overlap and are spaced apart in a stacking direction, and
the first and the second pads are simultaneously bonded to a flexible printed circuit board (FPCB) using a bonding tip comprising:
first and second ends having different lengths corresponding to the spaced positions of the first and second pads, respectively; and
a body part connecting the first and second ends.

2. The touch sensor according to claim 1, wherein the first pad is disposed adjacent to the portion exposed to the outside of the second touch sensor electrode layer.

3. The touch sensor according to claim 1, wherein the first pad and the second pad do not overlap in a length direction of the substrate.

4. The touch sensor according to claim 1, wherein the first pad and the second pad overlap in a length direction of the substrate.

5. The touch sensor according to claim 1, wherein the substrate is a polarizing plate.

6. The touch sensor according to claim 1, wherein the first and the second touch sensor electrode layers are made of a transparent conductive material.

7. The touch sensor according to claim 1, further comprising a flexible printed circuit board (FPCB) electrically connected to the first and the second pads.

8. A display device comprising:
a touch sensor according to claim 1; and
a display layer disposed on an opposing surface to a surface of the second touch sensor electrode layer in contact with the substrate.

9. The display device according to claim 8, wherein the display layer is an organic light-emitting diode (OLED) layer or a liquid crystal display (LCD) layer.

10. A bonding tip comprising:
first and second ends having different lengths corresponding to the spaced positions of the first and second pads spaced apparat in a stacking direction, respectively, according to claim 1; and
a body part connecting the first and second ends.

11. A method of manufacturing a display device comprising steps of:
forming a first touch sensor electrode layer including a first pad on a first surface of a substrate;
forming a second touch sensor electrode layer including a second pad on a protective film;
disposing the second touch sensor electrode layer on a second surface of the substrate such that the second pad is exposed to an outside of the substrate in the same direction as the first pad;
removing the protective film;
attaching a display layer to a surface of the second touch sensor electrode layer from which the protective film is removed; and
bonding a flexible printed circuit board (FPCB) simultaneously to the first and the second pads.

12. A method of manufacturing a display device comprising steps of:
forming a first touch sensor electrode layer including a first pad on a first surface of a substrate;
forming a second touch sensor electrode layer including a second pad on a protective film;
disposing the second touch sensor electrode layer on a second surface of the substrate such that the second pad is exposed to an outside of the substrate in the same direction as the first pad;
bonding a flexible printed circuit board (FPCB) simultaneously to the first and the second pads;
removing the protective film; and
attaching a display layer to a surface of the second touch sensor electrode layer from which the protective film is removed.

13. A method of manufacturing a display device comprising steps of:
forming a first touch sensor electrode layer including a first pad on a first surface of a substrate;
forming a second touch sensor electrode layer including a second pad on a display layer;
disposing the second touch sensor electrode layer on a second surface of the substrate such that the second pad is exposed to an outside of the substrate in the same direction as the first pad; and
bonding a flexible printed circuit board (FPCB) simultaneously to the first and the second pads,
wherein the step of bonding the FPCB simultaneously to the first and the second pads is performed using a bonding tip comprising: first and second ends having different lengths corresponding to the spaced positions of the first and second pads spaced apart in a stacking direction, respectively; and a body part connecting the first and second ends.

14. The method of manufacturing a display device according to claim 11, wherein the step of bonding the FPCB simultaneously to the first and the second pads is performed using a bonding tip comprising: first and second ends having dimensions corresponding to the positions of the first and second pads, respectively; and a body part connecting the first and second ends.

15. The method of manufacturing a display device according to claim 11, wherein the substrate is a polarizing plate.

16. The method of manufacturing a display device according to claim 12, wherein the step of bonding the FPCB simultaneously to the first and the second pads is performed using a bonding tip comprising: first and second ends having dimensions corresponding to the positions of the first and second pads, respectively; and a body part connecting the first and second ends.

17. The method of manufacturing a display device according to claim 12, wherein the substrate is a polarizing plate.

18. The method of manufacturing a display device according to claim 13, wherein the substrate is a polarizing plate.

* * * * *